(12) United States Patent
Yoneda et al.

(10) Patent No.: US 12,379,562 B2
(45) Date of Patent: Aug. 5, 2025

(54) OPTICAL SENSOR MODULE AND MANUFACTURING METHOD THEREOF

(71) Applicant: Mitsubishi Electric Corporation, Tokyo (JP)

(72) Inventors: Yutaka Yoneda, Tokyo (JP); Akihiro Matsusue, Tokyo (JP); Kento Mori, Tokyo (JP); Tomohiro Maegawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 505 days.

(21) Appl. No.: 17/620,193

(22) PCT Filed: Aug. 27, 2019

(86) PCT No.: PCT/JP2019/033421
§ 371 (c)(1),
(2) Date: Dec. 17, 2021

(87) PCT Pub. No.: WO2021/038707
PCT Pub. Date: Mar. 4, 2021

(65) Prior Publication Data
US 2022/0238587 A1    Jul. 28, 2022

(51) Int. Cl.
*G02B 7/02* (2021.01)
*H10F 39/00* (2025.01)
(Continued)

(52) U.S. Cl.
CPC ............. *G02B 7/02* (2013.01); *H10F 39/024* (2025.01); *H10F 39/804* (2025.01); *H10F 77/40* (2025.01);
(Continued)

(58) Field of Classification Search
CPC ............. H01L 27/14627; H01L 23/544; H01L 27/14618; H01L 27/14685;
(Continued)

(56) References Cited

U.S. PATENT DOCUMENTS 7,880,984 B2 *   2/2011   Yen ................... G02B 13/0035
                                                  359/822
2009/0073855 A1 *   3/2009   Ishii ....................... G11B 7/082
(Continued)

FOREIGN PATENT DOCUMENTS

JP    2004-037478 A        2/2004
JP    2006088088 A *        4/2006
(Continued)

OTHER PUBLICATIONS

An Office Action; "Notice of Reasons for Refusal," mailed by the Japanese Patent Office on Oct. 4, 2022, which corresponds to Japanese Patent Application No. 2021-541829 and is related to U.S. Appl. No. 17/620,193; with English language translation.
(Continued)

*Primary Examiner* — Georgia Y Epps
*Assistant Examiner* — Erin R Garber
(74) *Attorney, Agent, or Firm* — Studebaker Brackett PLLC

(57) ABSTRACT

An optical sensor module comprises a substrate, a photodetector which detects light and is fixed to the substrate and a lens holding member, to which a lens is fixed, which is fixed to the substrate at a position surrounding the photodetector, and the lens is fixed in the state in which an outer circumference of the lens is covered by a material itself of the lens holding member, and a part of an outer edge of the lens is exposed at a side of an outer surface of the lens holding member or at a side of an inner surface of the lens holding member.

21 Claims, 14 Drawing Sheets

(51) Int. Cl.
 *H10F 77/40* (2025.01)
 *H01L 23/544* (2006.01)

(52) U.S. Cl.
 CPC ............ *G02B 7/025* (2013.01); *H01L 23/544* (2013.01); *H01L 2223/54426* (2013.01); *H10F 39/8063* (2025.01)

(58) Field of Classification Search
 CPC . H01L 2223/54426; H01L 2223/54473; H01L 31/0232; G02B 7/02; G02B 7/025; G02B 7/022; G02B 7/026; Y02P 70/50; H10F 39/024; H10F 39/804; H10F 77/40; H10F 39/8063
 See application file for complete search history.

(56) References Cited

U.S. PATENT DOCUMENTS

| | | | | |
|---|---|---|---|---|
| 2014/0298642 | A1* | 10/2014 | Sesti | ............ H04N 23/55 29/592.1 |
| 2017/0176705 | A1* | 6/2017 | Wang | ............ H01L 27/14618 |
| 2021/0223517 | A1* | 7/2021 | Yamamoto | ............ G02B 27/0018 |
| 2021/0231838 | A1* | 7/2021 | Okada | ............ G02B 7/02 |
| 2021/0337093 | A1* | 10/2021 | Chu | ............ G02B 7/021 |

FOREIGN PATENT DOCUMENTS

| | | | | |
|---|---|---|---|---|
| JP | 2006-317498 | A | 11/2006 | |
| JP | 2008-292676 | A | 12/2008 | |
| JP | 2011-069649 | A | 4/2011 | |
| JP | 2011-100526 | A | 5/2011 | |
| JP | 2018074256 | A * | 5/2018 | ... H01L 2224/73265 |

OTHER PUBLICATIONS

An Office Action; "Notice of Reasons for Refusal," mailed by the Japanese Patent Office on Jan. 10, 2023, which corresponds to Japanese Patent Application No. 2021-541829 and is related to U.S. Appl. No. 17/620,193; with English language translation.

An Office Action mailed by China National Intellectual Property Administration on Jun. 27, 2023, which corresponds to Chinese Patent Application No. 201980099592.8 and is related to U.S. Appl. No. 17/620,193; with English language translation.

International Search Report issued in PCT/JP2019/033421; mailed Sep. 24, 2019.

* cited by examiner

OPTICAL SENSOR MODULE AND MANUFACTURING METHOD THEREOF

TECHNICAL FIELD

This application relates to an optical sensor module and a method of manufacturing an optical sensor module.

BACKGROUND ART

Conventionally, regarding an optical sensor module which comprises a photodetector such as an infrared detector, an optical sensor module which stores an optical sensor in a metallic cap is well known.

Regarding the above mentioned optical sensor module, an optical sensor, in which a lens is placed in an incident window of a metallic cap, is known. Regarding an optical sensor module in which a lens is placed in an incident window of a metallic cap, when light is focused by the lens on a light receiving portion of a sensor so as to form an image, a picture or a temperature distribution can be detected. Regarding an optical sensor module in which a lens is placed in an incident window of a cap, it is necessary to position a lens and a sensor with high accuracy. However, regarding the above mentioned conventional optical sensor module, there are many elements (parts which affect positioning of a sensor and a lens) which intervene between a sensor and a lens, therefore, a lens and a sensor cannot be positioned with high accuracy.

On the contrary, in order to make it possible to position a lens and a sensor with high accuracy, a manufacturing method, in which an alignment mark which is used for positioning a sensor and a lens is formed on a circuit board, a sensor is die bonded on a circuit board while observing the alignment mark and a lens is mounted while observing the alignment mark, is disclosed (refer to Patent Document 1).

PRIOR ART DOCUMENT

Patent Document

Patent Document 1: JP2011-69649A

SUMMARY OF THE INVENTION

Problems to be Solved by the Invention

Regarding an optical sensor module which is described in Patent Document 1, a cap is made of metal and is made separately from a lens, therefore the optical sensor module has a configuration by which an optical center of a lens can be recognized easily by an recognition camera. However, there is a problem such that a metal cap is expensive. In order to reduce cost of an optical sensor module, a method, for example, in which a pedestal for holding a lens is not used or in which a cap, which is fixed to a specific position in advance without using an adhesive agent, is used or in which a cap which is made of resin not of metal is used, etc. is considered.

In a case where a lens is fixed to a cap (lens holding member) in advance without using an adhesive agent, in order to fix the lens, it is necessary to support the outer circumference of the lens with the cap, therefore, an outer edge of the lens cannot be observed from outside, as a result, an optical center of the lens cannot be recognized easily. In addition, once the cap is bonded to a substrate, a position of the lens cannot be corrected. Therefore, even in a case where the lens is mounted while observing an alignment mark, in order to position the lens and a sensor with high accuracy, it is necessary to use active alignment in which in the state of driving the sensor, the lens is mounted while checking an image through the lens.

This application discloses a technology for solving the above mentioned problems and aims to provide an optical sensor module in which a lens holding member to which a lens is fixed in advance to be unified is not positioned with active alignment, the lens and a sensor can be positioned in a short time with high accuracy, and a method of manufacturing the optical sensor module.

Means for Solving Problems

An optical sensor module which is disclosed by this application comprises a substrate, a photodetector which is fixed to the substrate and detects light, a lens holding member to which a lens is fixed and which is fixed to the substrate at a position surrounding the photodetector wherein the lens is fixed by the state in which an outer circumference of the lens is covered by a material itself of the lens holding member and a part of an outer edge of the lens is exposed at a side of an inner surface of the lens holding member or at a side of an outer surface of the lens holding member.

Further, a method of manufacturing an optical sensor module which is disclosed by this application is a method of manufacturing an optical sensor module in which an outer edge of a lens is circle, and the method comprises a step of capturing an image of a part of a lens holding member at which the lens is fixed from a side where an outer edge of the lens is exposed and obtaining a position of an optical center of the lens from a circle which includes at least three points of an outer edge of the lens in the image which is captured, and a step of setting a position of the lens holding member for the optical center of the lens which is obtained to be placed directly above a light receiving portion of a photodetector and fixing the lens holding member and a substrate.

Effects of Invention

According to an optical sensor module and a method of manufacturing an optical sensor module which is disclosed by this application, an optical sensor module by which a lens and a sensor can be positioned in a short time with high accuracy without using active alignment and a method of manufacturing the optical sensor module can be obtained.

MODE FOR CARRYING OUT THE INVENTION

Embodiments of an optical sensor module accord according to this application will be described referring to figures. Here, in each figure, a same reference sign will be given to a same or a similar component. Further, in order to avoid to make following description redundancy unnecessarily so as for a person skilled in the art to be able to understand the description easily, in some cases, description regarding well known matters and duplicate description regarding substantially same configuration may be omitted.

Further, regarding each figure, a size or a scale of each responding component is independent. For example, in some cases, regarding a figure in which a part of configuration is changed and a figure in which a part of configuration is not changed, a size or a scale of same part of configuration may be different. Further, regarding a configuration of an optical sensor module, actually, a plurality of members is provided additionally, however, only a part which is necessary to describe in this application is described, and description of other parts may be omitted. Further, in the following description, as an optical sensor module, an optical sensor module which detects infrared rays is described as an example. However, each embodiment can be applied to various kinds of optical sensor module such as an optical sensor module not of infrared rays but of visible light which has same problems.

Embodiment 1

Figure 1:
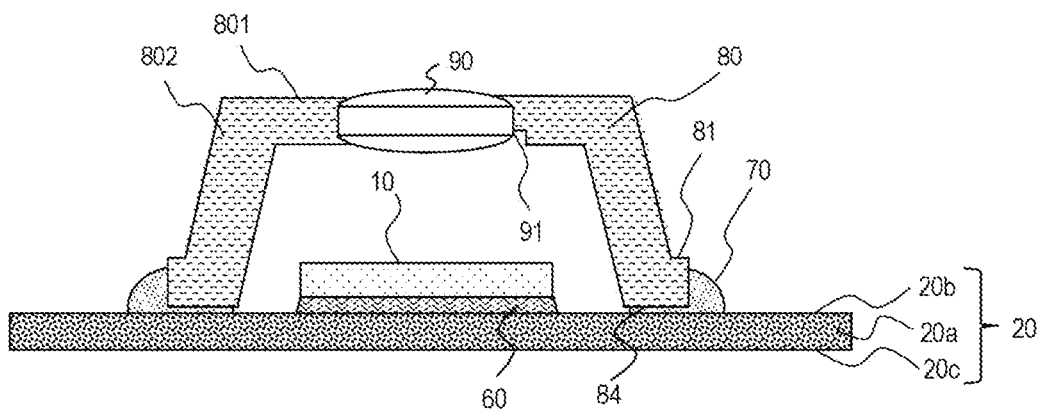
FIG. 1 is a cross section showing a configuration of an optical sensor module according to Embodiment 1.
Figure 2:
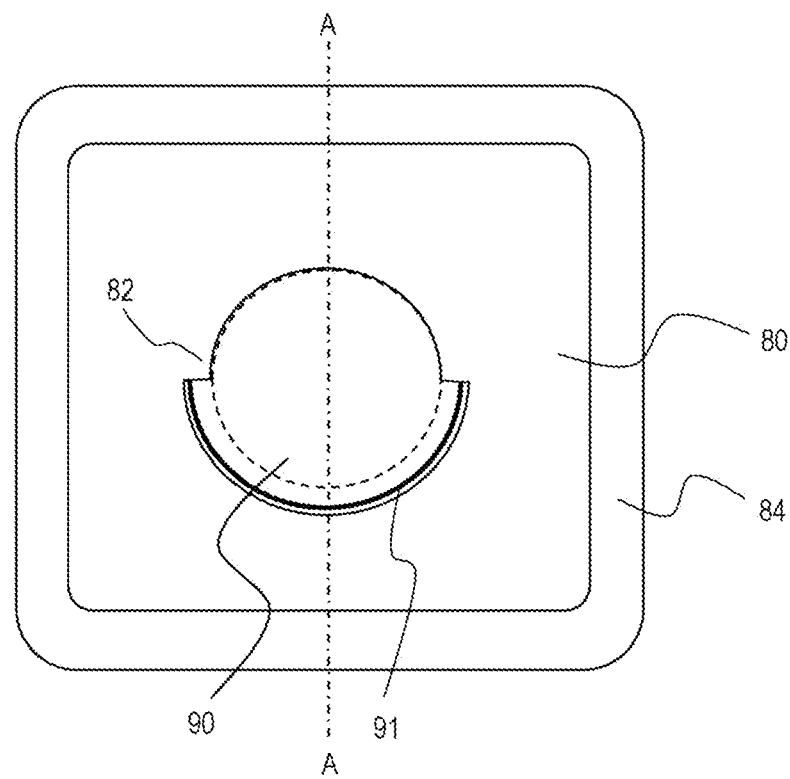
FIG. 2 is a bottom view showing a configuration of a lens holding member of an optical sensor module according to Embodiment 1.

FIG. 1 is a cross section showing a schematic configuration of an optical sensor module according to Embodiment 1, FIG. 2 is a plan view showing a lens holding member 80 observed from a side where the holding member 80 is bonded to a glass epoxy substrate 20, that is, a bottom view. FIG. 1 is a cross section taken on line A-A of FIG. 2. As a basic configuration, an optical sensor module comprises an infrared detector 10 as a photodetector, the glass epoxy substrate 20 as a substrate, and the lens holding member 80 in which a lens 90 which transmits infrared rays so as to focus a light is inserted after being molded and to which the lens is fixed by caulking surroundings of the lens 90 with a resin. The infrared detector 10 is stuck to one surface of the glass epoxy substrate 20 with an Ag paste 60 and is fixed to an inner part which is covered by the lens holding member 80 so as to be stored. A bottom surface 84 of the lens holding member 80 to which the lens 90 is fixed is bonded to the glass epoxy substrate 20 with an adhesive agent 70.

Here, in FIG. 1 and FIG. 2, only basic components of an optical sensor module are shown, and components which are not directly related to this application, that is, other members which are joined on the glass epoxy substrate 20 such as a custom IC, a wire, a capacitor, a connecter, etc., are not shown in figures.

The infrared detector 10 is a thermal type infrared sensor, for example, a resistance bolometer type sensor represented by vanadium oxide (VOx) or a SOI (Silicon on Insulator) diode bolometer type sensor which utilizes temperature characteristic and is made of Si. Further, at an end of the infrared detector 10, in order to bond the lens holding member 80 to a position where infrared rays which transmit the lens 90 are focused with regard to a light receiving portion of the infrared detector 10, an alignment mark (an alignment mark 11 shown in FIG. 14 which will be described later) is formed.

The glass epoxy substrate 20 as a substrate is a substrate which contains circuits which perform various functions. The glass epoxy substrate 20 comprises a plate-shaped glass epoxy base material 20a, and an electrode pattern 20b and an electrode pattern 20c which are formed on both surfaces of the glass epoxy base material 20a. The electrode pattern 20b and the electrode pattern 20c electrically connect the infrared detector 10 which is fixed on the glass epoxy substrate 20 and other electronic devices which are not shown in figures. and also provide an interface, etc. which connects to other circuit substrate and a power supply which is provided outside. The glass epoxy base material 20a is an electrical insulator, therefore, due to the difference of coefficient of linear expansion between the lens holding member 80 which is bonded to the glass epoxy substrate 20 with the adhesive agent 70, the infrared detector 10 which is joined to the electrode pattern 20b and the electrode pattern 20c with an Ag paste 60, and other electronic devices, etc., while the optical sensor modulator operates, stress is generated due to increase of temperature. In order to avoid generating deformation such as warp which is caused by the stress, it is preferable such that the glass epoxy base material 20a is thick, and generally, for example, the glass epoxy base material 20a having a thickness in a range of 0.8 mm to 1.0 mm is used.

Further, in FIG. 1, an example in which only one piece of the infrared detector 10 is placed on the glass epoxy substrate 20 is shown, however, a plurality of infrared detectors 10 may be placed on one piece of the glass epoxy substrate 20. Further, the number of the glass epoxy substrate 20 is one, however, the number of the glass epoxy substrate 20 is not limited to one. For example, a configuration, in which in one piece of the glass epoxy substrate 20, a plurality of same electrode patterns are provided, on each of the electrode patterns, one piece of the infrared detector 10 and other electronic device are placed and joined, a region of each of the infrared detector 10 is covered with the lens holding member 80, individually so as to be sealed, and then whole of region is divided by each electrode pattern, is acceptable.

Regarding the electrode pattern 20b and the electrode pattern 20c, generally, a same material is used. To the electrode pattern 20b, which is one of the electrode patterns, the infrared detector 10 is bonded with an Ag paste 60, and further by forming a join with an Au wire, etc., the electrode pattern 20b electrically connects other electronic device and the infrared detector 10. The abovementioned electrode pattern 20b is a wiring member for electrically connecting the infrared detector 10 and other circuit, therefore, it is preferable such that the electrode pattern 20b is a metal which has small electrical resistance. Consequently, it is general such that, for example, a Cu foil having a thickness of 10 to 40 μm is used for the electrode pattern 20b, 20c.

The electrode pattern 20b which is formed on the glass epoxy substrate 20 and the infrared detector 10 are joined with the Ag paste 60 which is a joint material. When the infrared detector 10 is joined with the Ag paste 60, other electronic components are joined on the glass epoxy substrate 20 with a solder in advance. Therefore, in order to avoid for a solder in surroundings to be melt again when the infrared detector 10 is joined, it is preferable such that a curing temperature of the Ag paste 60 is less than a melting point of the solder. Further, in order to avoid increasing a rise in temperature of the infrared detector 10, it is preferable such that a joint material has large thermal conductivity. Consequently, it is not limited to use an Ag paste as a joint material, and other conductive adhesive agents or a sintered joint material such as Ag nanoparticle paste may be used, however, from a view point of bonding temperature, thermal conductivity, cost, etc., it is preferable to use an Ag paste.

An adhesive agent 70 bonds a bottom surface 84 of the lens holding member 80 to a surface of the glass epoxy substrate 20 at a side where the infrared detector 10 is joined. When the lens holding member 80 is bonded with the adhesive agent 70, on a surface of the glass epoxy substrate 20, the infrared detector 10 is bonded with the Ag paste 60, other electronic components are joined with a solder and an Au wire, etc., which is a member for electrically connecting them, is wired. Therefore, in order to avoid breaking other members which are mounted on the glass epoxy substrate 20 and to avoid melting a solder again when the adhesive agent 70 is cured, it is preferable such that a curing temperature of the adhesive agent 70 is lower than a heatproof temperature of the infrared detector 10, other electronic components and the lens holding member 80, and a melting point of a solder.

The lens holding member 80 consists of a flat plated top surface part 801 and a side part 802 which extends to an outer edge of the top surface part 801, and is made of a thermoplastic resin, a thermosetting resin, a metal, etc. In Embodiment 1, a shape of the top surface part 801 is square, however, oblong, circle, or ellipse is acceptable. Further, as shown in FIG. 2 which is a figure of the lens holding member 80 observed from a side of the bottom surface 84, in the top surface part 801 of the lens holding member 80, the lens 90 is fixed by the lens holding member 80 itself. At a side of the bottom surface 84 of the lens holding member 80, that is, at a side of an inner surface, in only semicircle of the outer circumference of the lens 90, the outer edge 91 of the lens 90 is exposed and the other part of the outer circumference of the lens 90 is covered with a lens holding part 82 which is composed of a resin for forming the lens holding member 80. Fixing of the lens 90 will be performed as follows. First, by injection molding, the lens holding member 80, which has an opening part for inserting the lens 90 and has the lens holding part 82 which is formed at a side of an inner surface of the opening part, is manufactured. The lens 90 is inserted to the opening part from a side of an outer surface of the lens holding member 80. After that, by deforming a resin at a side of an outer surface of the lens holding member 80 in surroundings of the lens 90 with heat to be caulked, the lens 90 is fixed to the lens holing member 80. Consequently, as shown in a cross section of FIG. 1, regarding a side of an outer surface of the lens 90, whole of the outer circumference is covered with a resin which constitutes the lens holding member 80.

Regarding the lens holding member 80 to which the lens 90 is fixed, in order for infrared rays which transmit the lens 90 to be focused at a light receiving portion of the infrared detector 10, whole of circumference of the bottom surface 84 is bonded to the glass epoxy substrate 20 with the adhesive agent 70 so as to be fixed. After the lens holding member 80 is bonded, by evacuating inside the lens holding member 80, the infrared detector 10 is sealed. In order to increase a bonding area of the bottom surface 84 which is a surface to which the lens holding member 80 is bonded so as to increase bonding strength, as shown in FIG. 1, an edge part 81 is formed so as for each side of the bottom surface 84 to protrude outside.

In a case where a thermoplastic resin is used for the lens holding member 80, generally, PC (Polycarbonate) is used. In addition to PC, PA66 (NYLON66), PBT (Polybutylene Terephthalate), PPS (Poly Phenylene Sulfide), etc. may be used. The abovementioned resins have high heat resistance, therefore even in a case where heating is necessary when the adhesive agent 70 is cured, heating temperature can be set to be high, therefore, the abovementioned resins are preferable. Regarding the adhesive agent 70 which bonds the bottom surface 84 of the lens holding member 80 to the glass epoxy substrate 20, it is preferable to apply the adhesive agent 70 to be a thickness which can absorb warpage amount of the glass epoxy substrate 20 and stress which is generated by the difference of coefficient of linear expansion between the lens holding member 80 and the glass epoxy substrate 20. Concretely, it is preferable for a thickness of the adhesive agent 70 to be applied is 10 to 300 μm.

The lens 90 in Embodiment 1 is a circular silicon lens whose both surfaces are convex sphere and whose optical center is located at the center. At a side of an inner surface of the lens holding member 80, a portion of the outer circumference of the lens 90 where a semicircle is excluded is covered by the lens holding part 82 which is composed of a resin for forming the lens holding member 80 so as for the lens 90 to be fixed by the lens holding member 80 itself. In the lens holding member 80 to which a lens is fixed, a semicircle of the outer edge 91 of the lens 90 is exposed at a side of an inner surface. When the lens holding member 80 is moved, the lens 90 is also moved together with the lens holding member 80, therefore, the relative position with regard to the infrared detector 10 will be changed by moving of the lens holding member 80. Further, the lens 90 transmits infrared rays, however, the lens 90 does not transmit a visible light, consequently, inside of the lens holding member 80 cannot be observed through the lens 90.

In order to correctly image an object by the infrared detector 10, regarding a position of the lens 90, it is assembled for the lens 90 to be located directly above a light receiving portion of the infrared detector 10 so as for a focus point of the lens 90 to be overlapped with a light receiving portion of the infrared detector 10. However, in a case where the outer edge of the lens 90 is completely covered by the lens holding member 80, an optical center of the lens 90 cannot be recognized based on an external appearance. Variations of amount of a resin which covers the lens 90 of the lens holding member 80 and variations of a fixing position of the lens 90 with regard to the lens holding member 80 exist. Therefore, when an optical center cannot be recognized based on an external appearance, it is not possible to position a light receiving portion of the infrared detector 10 and an optical center of the lens 90 with high accuracy. When a position of an optical center of the lens 90 deviates from directly above the infrared detector 10, there is a risk such that the infrared detector 10 cannot image an object or an image may be missing even in subtle displacement, etc.

On the electrode patter 20b of the glass epoxy substrate 20 which is stored inside the lens holding member 80, a wiring member, etc. for operating the infrared detector 10 exists. When the lens holding member 80 is arranged on the adhesive agent 70, in a case where a direction of the lens holding member 80 does not appropriately match a direction of the glass epoxy substrate 20, the bottom surface 84 of the lens holding member 80 or an inner wall of a side part 802 will contact with a wiring member inside the lens holding member 80. A wiring member which contacts with the bottom surface 84 of the lens holding member 80 or the inner wall will be deformed so as to contact with a wiring member in surroundings or a wiring will be cut. Consequently, there is a risk such that a failure, such as malfunction of an optical sensor module may be caused.

In a case of an optical sensor module in which a lens is another body being separated from a lens holding member, without moving the lens holding member, by moving only the lens, a position of the lens can be adjusted, when there is subtle displacement, after the lens holding member is bonded to a substrate, a position of the lens can be readjusted so as for a focus point of the lens to be overlapped with a light receiving portion of an infrared detector. However, according to an optical sensor module of this application, the lens 90 is integrally molded with the lens holding member 80 and fixed, therefore after the lens holding member 80 is mounted on the adhesive agent 70, a position of the lens 90 cannot be adjusted. Consequently, even before the adhesive agent 70 is cured, in comparison with an optical sensor module in which the lens holding member 80 and the lens 90 are formed separately, the risk such that occurrence of a failure due to mismatch of relative position of a light receiving portion of the infrared detector 10 and a focal point of the lens 90 is higher.

In order to avoid the above mentioned failure, it is important such that even in the state in which the lens 90 is fixed to the lens holding member 80, a focal point of the lens 90 is correctly recognized, and further, the lens holding member 80 is fixed so as for the bottom surface 84 of the lens holding member 80 to face always in the same direction with regard to the glass epoxy substrate 20.

For correctly recognizing a focal point of the lens 90 even in the state where the lens 90 is fixed to the lens holding member 80, a method of active alinement can be used. An active alinement is a method in which in fixing the lens holding member 80 to the glass epoxy substrate 20, by actually driving the infrared detector 10 and observing a test chart through the lens 90, optical-axis alignment is performed. In order to install the lens holding member 80 on the glass epoxy substrate 20 by using an active alinement, it is necessary to perform wiring and energize for driving the infrared detector 10 which is bonded to the glass epoxy substrate 20. Consequently, an active alinement cannot be used for a configuration in which a plurality of same electrode patterns are provided in one piece of a glass epoxy substrate 20, on each electrode pattern, one piece of a infrared detector 10 and other electronic devices are placed to be bonded, and after a region of each of the infrared detectors 10 is covered with the lens holding member 80 individually so as to be sealed and the region is cut for each electrode pattern to be divided. In order to adjust a position of a lens by an active alinement, it is necessary to install the lens holding member 80 one by one in the state where the region is cut for each electrode pattern. Therefore, it requires time for assembling one product. In addition to that, it is necessary to provide a test chart inside a machine, therefore, in comparison with a general mounter machine, a size of the machine will be large and a price of the machine will be expensive.

According to an optical sensor module in Embodiment 1, as shown in FIG. 1 and FIG. 2, at a side of the bottom surface 84 of the lens holding member 80, that is, in a semicircle at a side of an inner surface, the outer edge 91 of the lens 90 which is fixed is exposed from the lens holding member 80 so as to be observed from a side of an inner surface. The outer edge of the lens 90 other than the abovementioned part is covered by the lens holding part 82 which is composed of a resin for forming the lens holding member 80. It is possible such that before the lens holding member 80 is mounted on the adhesive agent 70, an image of the lens 90 is captured by a camera from a side of the bottom surface 84 of the lens holding member 80, the outer edge 91 of the lens 90 which is exposed from the lens holding member 80 is extracted from the image which is captured. In a case of circular lens, based on the outer edge 91 of the lens 90 which is extracted, an optical center of the lens can be recognized as follows.

Figure 3:
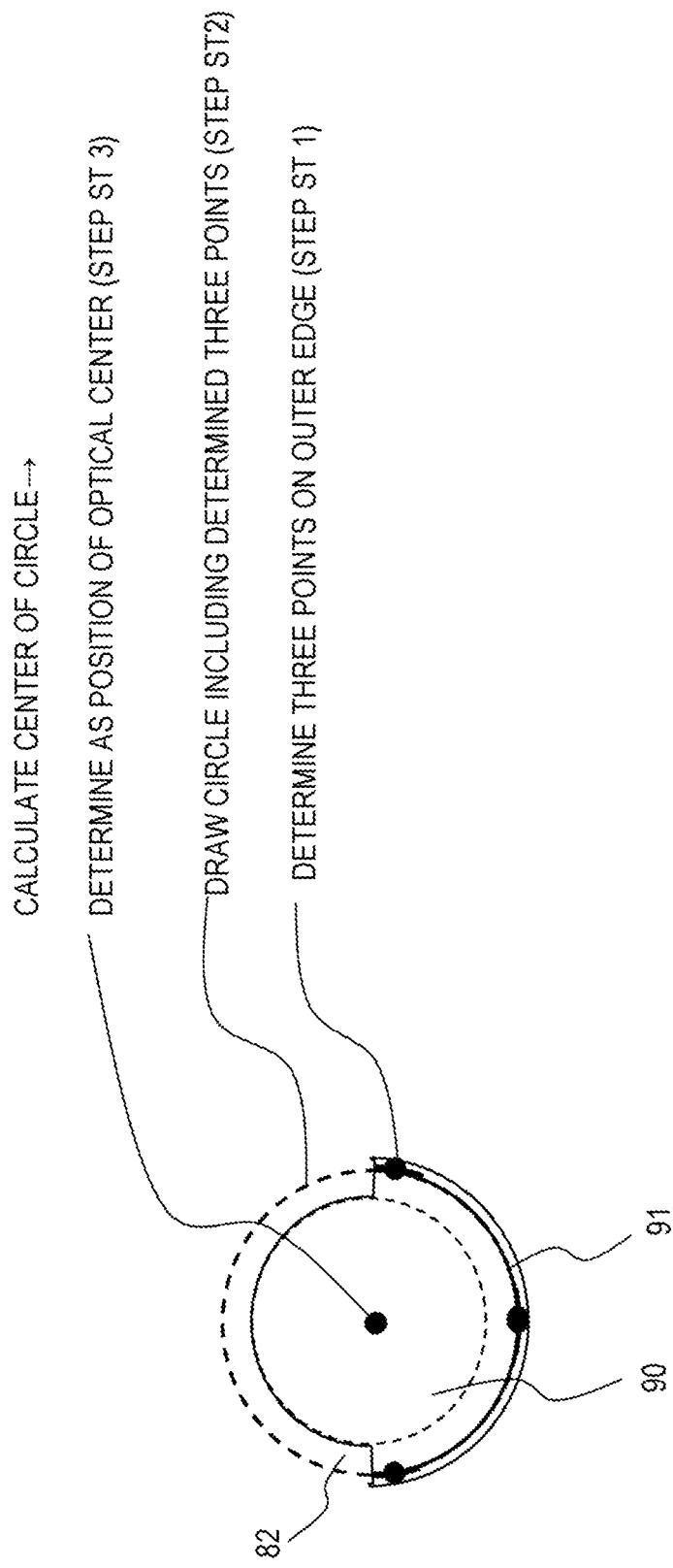
FIG. 3 is a figure for describing one step of a method of manufacturing an optical sensor module according to Embodiment 1.

As shown in FIG. 3, based on the image showing a part to which the lens 90 is fixed which is captured by the camera, the outer edge 91 of the lens 90 is extracted, as different positions on the outer edge 91 which is extracted, positions of at least three points are determined (Step ST1) and a circle including the three points which are determined is drawn (Step ST2). Next, a position of a center of the circle is obtained by calculation. When an outer edge shape of the lens 90 is circle, the circle which is drawn conforms to an outer edge shape of the lens 90 including a part which is covered with a resin of the lens holding member 80. Consequently, in a case where an optical center of the lens 90 is located at the center, a center of the circle which is drawn is an optical center of the lens 90. Accordingly, the center of the circle which is obtained by calculation is determined as a position of an optical center (Step ST3). As above mentioned, even in the state where the lens holding member 80 and the lens 90 are fixed, a position of an optical center of the lens 90 with regard to the lens holding member 80 can be correctly recognized.

Further, when the lens holding member 80 is bonded to the substrate 20, it is necessary to match a direction of the lens holding member 80 to a direction of the substrate 20. Therefore, it is necessary to know a direction of the lens holding member 80 together with a position of an optical center of the lens 90. In a case where a shape of the lens holding member 80 is square as shown in FIG. 1 or oblong, for example, by recognizing the whole of circumference of a bottom surface of the lens holding member 80 with a camera and measuring an angle which is formed by one side of the whole of circumference and a straight line as a reference line, a direction of the lens holding member 80 can be recognized. In addition to that, as a method for recognizing a direction of the lens holding member 80, a general method is to image the overall of the lens holding member 80 and compare with an original image. However, size of the lens 90 is small with regard to the lens holding member 80, therefore, in order to recognize a direction of the lens holding member 80 and a position of an optical center of the lens 90, it is necessary to use two cameras which have different magnification or to recognize an optical center of the lens 90 using a camera which has lower magnification which is matched to size of whole of the lens holding member 80.

According to an optical sensor module in Embodiment 1, the lens holding member 80 is manufactured by injection molding. Consequently, a position where the outer edge 91 of the lens 90 is exposed from the lens holding member 80 is always constant with regard to a direction of the lens holding member 80. An image of the vicinity of the lens 90 including the lens 90 of the lens holding member 80 in a case where a direction of the bottom surface 84 of the lens holding member 80 is intended direction with regard to the glass epoxy substrate 20 is stored in advance. By recognizing an optical center of the lens 90, at the same time, by comparing a direction of the image of the vicinity of the lens 90 which is obtained as shown in FIG. 3 with an image which is stored so as to make the two images same, a direction of the lens holding member 80 can be corrected. As above mentioned, without imaging whole of the lens holding member 80, and by imaging only a part of the lens holding member 80 to which the lens 90 is fixed with one camera which has higher magnification, an optical center of the lens 90 and a direction of the holding member 80 can be recognized at the same time.

Consequently, a method which is described in Embodiment 1 can be applied to a configuration, to which an active alinement cannot be applied, in which a plurality of infrared detectors are placed in one piece of glass epoxy substrate and a region of each of the infrared detectors is covered with the lens holding member 80 so as to be sealed. According to the abovementioned method, an optical sensor module can be assembled with higher accuracy, in shorter time and at lower cost in comparison with a conventional method.

According to an actual experiment, in a case where the lens 90 is assembled without positioning with regard to the lens holding member 80, an assembling accuracy (deviation between a light receiving portion of the infrared detector 10 and an optical center of the lens 90) is approximately +/−150 μm and in a case where the lens 90 is assembled by using an external shape of the lens holding member 80 as a reference and positioning an external shape of the lens 90, an assembling accuracy of the lens 90 is approximately +/−130 μm. On the other hand, an assembling accuracy in a case where the lens 90 is assembled by recognizing an optical center of the lens 90 according to a configuration and a method in Embodiment 1 is approximately +/−25 μm.

Regarding the outer edge 91 of the lens 90 to be exposed, as long as air tightness inside the lens holding member 80 is maintained and the lens 90 does not fall from a part which is exposed, any size of the outer edge 91 of the lens 90 may be exposed from any part of the lens holding member 80. For example, the outer edge 91 of the lens 90 may be exposed at a side of an outer surface of the lens holding member 80. In this case, regarding a side of an inner surface of the lens 90, whole of the outer circumference is covered with a resin which constitutes the lens holding member 80. According to the abovementioned configuration, a camera, for recognizing an optical center and a direction of the lens 90 which will be described in following Embodiment 5, is mounted to a side of a nozzle to which the lens 90 is attached by suction and which transports the lens 90. Further, regarding a length of the outer edge 91 of the lens 90 to be exposed, in a case where a length of the outer edge 91 of the lens 90 is shorter, a chance of occurrence of falling off of the lens 90 from an exposed part will be reduced, however, regarding three or more points for determining as an outer edge of the lens 90, in a case where they are apart each other as far as possible, a circle approximating the outer edge of the lens 90 can be drawn more correctly. Consequently, regarding a length of the outer edge 91 of the lens 90 to be exposed, concretely, it is preferable to be a length which is 90 to 180 degrees in 360 degrees of whole of the outer edge of the lens 90, that is, it is preferable to be a length in a range which is more than one quarter and less than half of whole of the outer edge.

As above described, regarding an optical sensor module in Embodiment 1, a part of the outer edge 91 of the lens 90 is exposed at a side of the bottom surface 84, that is, a side of an inner surface of the lens holding member or a side of an outer surface of the holding member 80, and an outer edge other than the above mentioned is covered with a resin which constitutes the lens holding member 80. Before the lens holding member 80 is bonded on the glass epoxy substrate 20, by determining at least three points of a position of an outer edge of the lens 90 with an image which is captured with a camera which is provided at a side of the bottom side 84 of the lens holding member 80 or which is provided at a side of an outer surface, an optical center of the lens 90 can be recognized. Consequently, without using an active alignment, a position of an optical center of the lens 90 can be recognized with high accuracy. In addition to that, by forming the lens holding member 80 for a position of the outer edge 91 of the lens 90 to be exposed to be always constant with regard to the lens holding member 80, a direction of the lens holding member 80 can be recognized by using one recognition camera having high magnification, and a direction of the lens holding member 80 and a direction of the substrate 20 can be matched. Consequently, a position of a light receiving portion of the infrared detector 10 and a position of an optical center of the lens 90 can be positioned with high accuracy, and crush or deformation of a wiring member which is generated by mismatching of a direction of the lens holding member 80 and the substrate 20 can be avoided. As a result, in a simple manufacturing process, an optical sensor module which has high quality can be provided.

Embodiment 2

Figure 4:
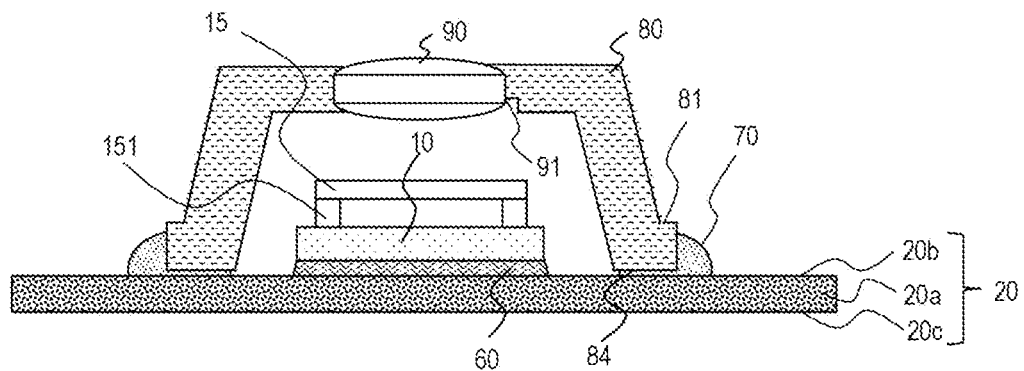
FIG. 4 is a cross section showing a configuration of an optical sensor module according to Embodiment 2.

FIG. 4 is a cross section showing a schematic configuration of an optical sensor module according to Embodiment 2. Basically, an optical sensor module according to Embodiment 2 has the same configuration as that of Embodiment 1, however, an optical sensor module according to Embodiment 2 is different from that of Embodiment 1 in following points. Here, mainly, different points will be described, and description regarding the same components will be omitted. Further, FIG. 4 is a schematic diagram showing only basic components in an optical sensor module, and description regarding other components will be omitted.

In Embodiment 1, after whole of circumference of a bottom surface 84 of a lens holding member 80 is bonded with an adhesive agent 70, by vacuuming inside the lens holding member 80, an infrared detector 10 is sealed. On the contrary, in Embodiment 2, as shown in FIG. 4, a transparency plate 15 which is a light transmitting member is bonded above the infrared detector 10 via a frame 151 keeping a distance from a surface of the infrared detector 10. The abovementioned configuration is different from that of Embodiment 1 in a point such that by vacuuming space which is formed between the infrared detector 10 and the transparency plate 15 so as to seal the infrared detector 10, and inside of the lens holding member 80 is not vacuum-sealed.

Regarding the transparency plate 15 which is formed of a silicon which is a material which transmits infrared rays in the same way as that of a lens 90, a part to which the frame 151 is bonded is coated with a metal and is bonded with a solder to the frame 151 which is bonded to a surface of the infrared detector 10. As above mentioned, the transparency plate 15 is fixed to a light incidence side of a light receiving portion of the infrared detector 10 so as to be unified with the infrared detector 10, consequently, a light receiving portion of the infrared detector 10 is covered. An inside space which is covered by the infrared detector 10, the frame 151 and the transparency plate 15 is vacuum-sealed. The transparency plate 15 transmits infrared rays, however, the transparency plate 15 does not transmit a visible light, therefore, a light receiving portion of the infrared detector 10 cannot be observed through the transparency plate 15. To make a position of mounting the infrared detector 10 and a direction recognizable from outside, an alignment mark is provided at a position which is a surface of the infrared detector 10 and is outside of the frame 151.

Figure 5:
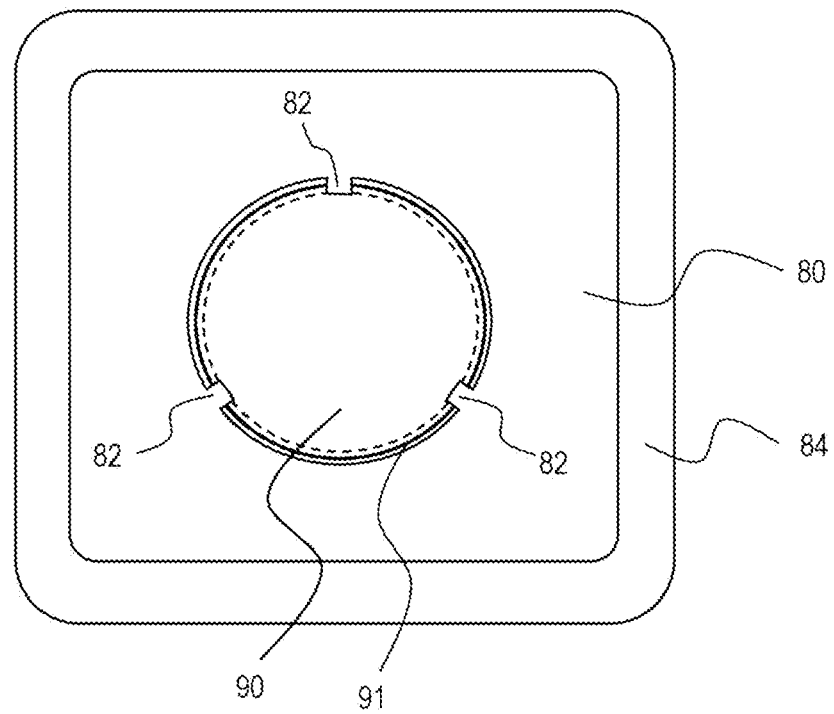
FIG. 5 is a bottom view showing a configuration of a lens holding member of an optical sensor module according to Embodiment 2.
Figure 6:
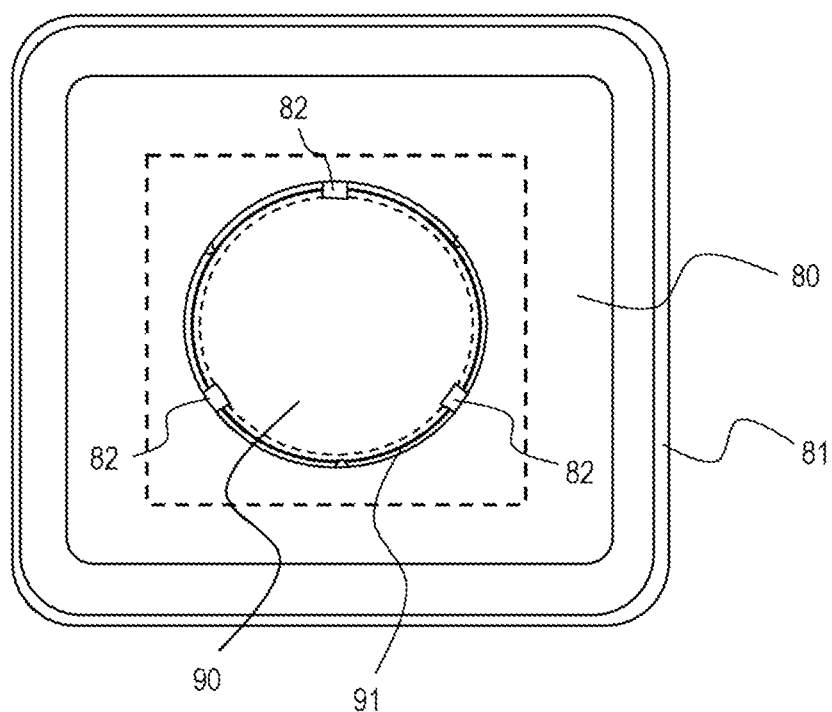
FIG. 6 is a top view showing another configuration of a lens holding member of an optical sensor module according to Embodiment 2.

FIG. 5 is a bottom view showing only the lens holding member 80 to which the lens 90 is fixed observed from a side of the bottom surface 84 in an optical sensor module according to Embodiment 2. As shown in FIG. 5, regarding the outer circumference of the lens 90, at a side of an inner surface of the lens holding member 80, only three parts are covered by lens holding parts 82 which are composed of a resin for forming the lens holding member 80. In the outer circumference other than the abovementioned parts of the lens 90, an outer edge 91 of the lens 90 is exposed. As shown in a cross section of FIG. 4, regarding a side of an outer surface of the lens 90, whole of circumference is covered with a resin which constitutes the lens holding member 80. The infrared detector 10 is vacuum-sealed by the transparency plate 15 and the frame 151, therefore, it is not necessary to vacuum-seal inside the lens holding member 80, and it is not necessary to maintain airtight at a part of the lens holding member 80 where the lens 90 is fixed. The lens holding member 80 may fix the lens with a resin to the extent that the lens 90 will not fall from the lens holding member 80. It is not limited to a configuration shown in FIG. 5 and for example, as shown in a plan view showing the lens holding member 80 observed from upward, that is, as shown in FIG. 6 which is a top view, a configuration in which the lens is fixed at a side of an outer surface of the lens holding member 80 by lens holding parts 82 which are provided at only three parts of the lens holding member 80 and are composed of a resin of the lens holding member 80, and at parts other than the above mentioned, the outer edge 91 of the lens 90 is exposed, is acceptable. In the abovementioned case, regarding a side of an inner surface of the lens 90, whole of circumference is covered with a resin which constitutes the lens holding member 80.

Figure 7:
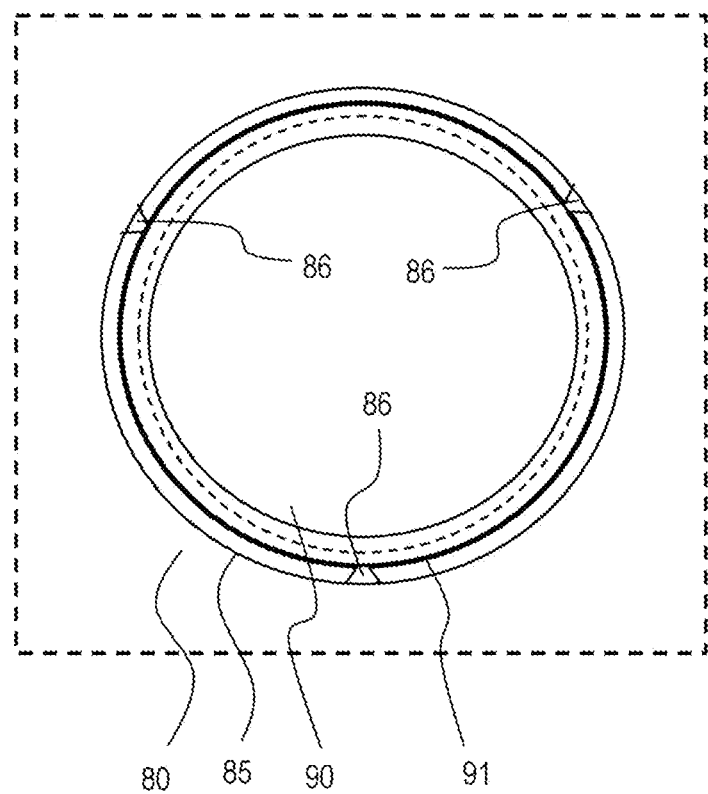
FIG. 7 is an enlarged view of the main part of a configuration of a lens holding member of an optical sensor module shown in FIG. 6 according o Embodiment 2.

FIG. 7 is a figure in which a region, which is surrounded with a broken line in FIG. 6, is enlarged. As shown in FIG. 7, the outer edge 91 of the lens 90 of the lens holding member 80, that is, a diameter of an inner wall 85 opposing a side surface of the lens 90 is larger than an external shape of the lens 90. According to a configuration, three projections 86 are provided at the inner wall 85 so as to fix a side surface of the lens 90. It is needless to say such that the projection 86 may be provided in a configuration in which the lens holding part 82 is provided at a side of an inner surface as shown in FIG. 5. By forming the projection 86, the lens can be fixed not with a circle but with points so as to make fixing of the lens which is covered with a resin of the lens holding member 80 to be minimum. According to the abovementioned configuration, a side surface of the lens 90 can be held in the lens holding member 80 and the lens 90 can be fixed with higher accuracy. In addition to that, when a part where the outer edge 91 of the lens 90 is exposed is to be a side of an outer surface of the lens holding member 80, that is, a light incidence side, an angle of view of the lens 90 can be enlarged. Further, an amount of use of a resin of the lens holding member 80 can be decreased, therefore, cost of a material which is required to make the lens holding member 80 can be decreased. The number of the projection 86 is not limited to three, and it is needless to say such that it is preferable to provide three or more projections 86.

According to the above mentioned configuration, at only three parts at a side of an inner surface or a side of an outer surface of the lens holding member 80, an outer edge of the lens 90 is covered, at a part other than the above mentioned, the outer edge 91 of the lens 90 is exposed. However, in a configuration in which the infrared detector 10 is vacuum-sealed by the transparency plate 15 and the frame 151, in the same way as that is described in Embodiment 1, more than half of the lens 90 may be covered with a resin of the lens holding member 80. Even in the abovementioned case, it is not necessary to vacuum-seal inside the lens holding member 80, therefore, it is not necessary for a part at which the lens 90 is fixed to be airtight.

Embodiment 3

Figure 8:
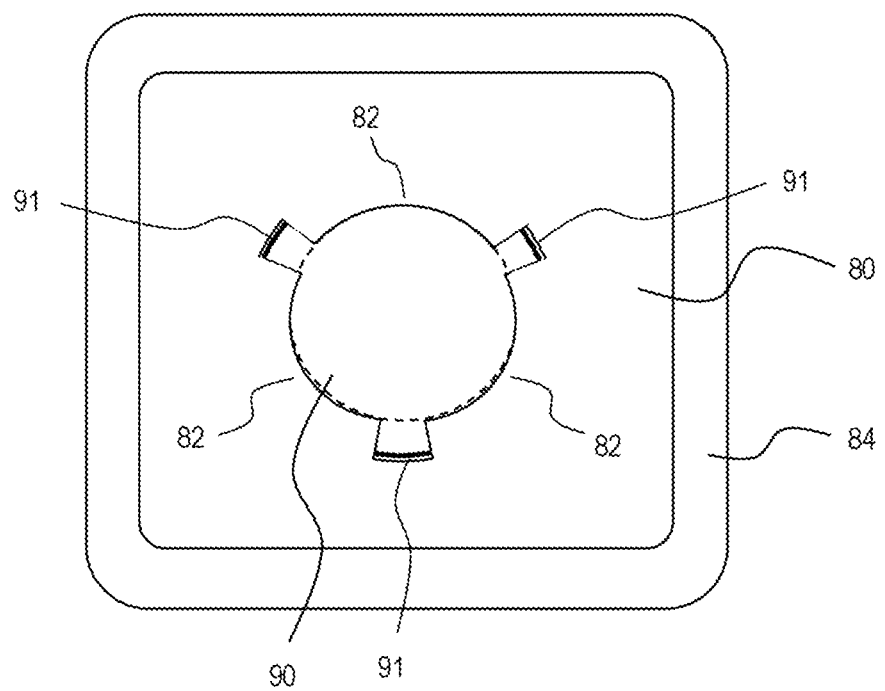
FIG. 8 is a bottom view showing a configuration of a lens holding member of an optical sensor module according to Embodiment 3.

FIG. 8 is a bottom view showing a lens holding member 80 of an optical sensor module according to Embodiment 3 observed from a side of a bottom surface 84. Basically, an optical sensor module according to Embodiment 3 has also the same configuration as that of Embodiment 1, however, an optical sensor module according to Embodiment 3 is different from that of Embodiment 1 in following points. Here, mainly, different points will be described, and description regarding the same components will be omitted. Further, FIG. 8 is a schematic diagram showing only a configuration of the lens holding member 80 in an optical sensor module according to Embodiment 3 and description regarding other components of an optical sensor module will be omitted.

In Embodiment 3, as shown in FIG. 8, at three parts which are dispersed at regular intervals of 120 degrees, an outer edge 91 of a lens 90 is exposed from the lens holding member 80 and the outer edge other than the above mentioned is covered by a lens holding member 82 which is composed of a resin for forming the lens holding member 80.

Figure 9:
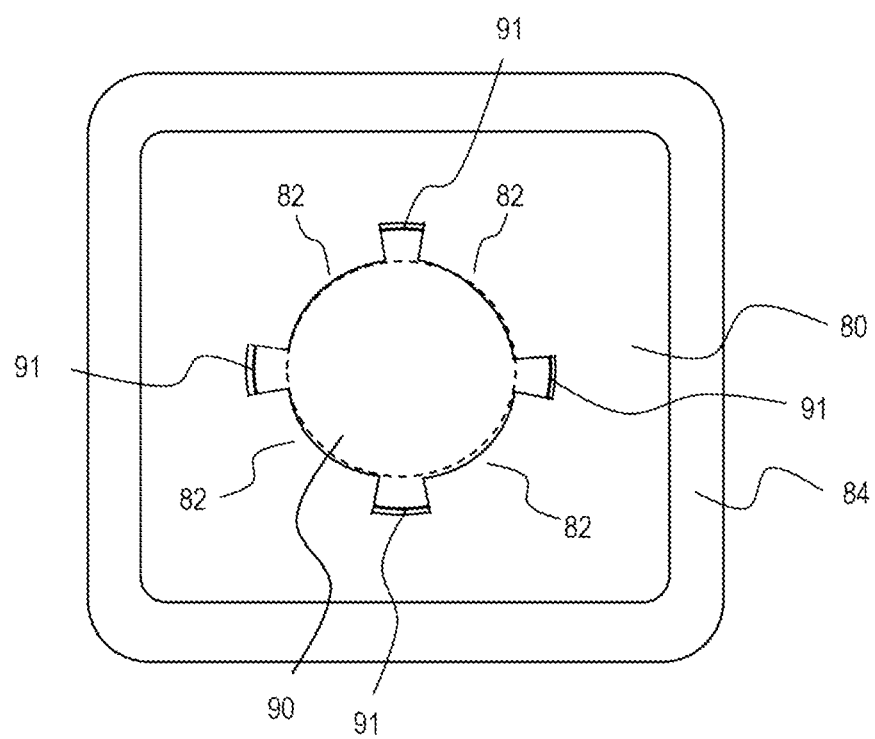
FIG. 9 is a bottom view showing another configuration of a lens holding member of an optical sensor module according to Embodiment 3.
Figure 10:
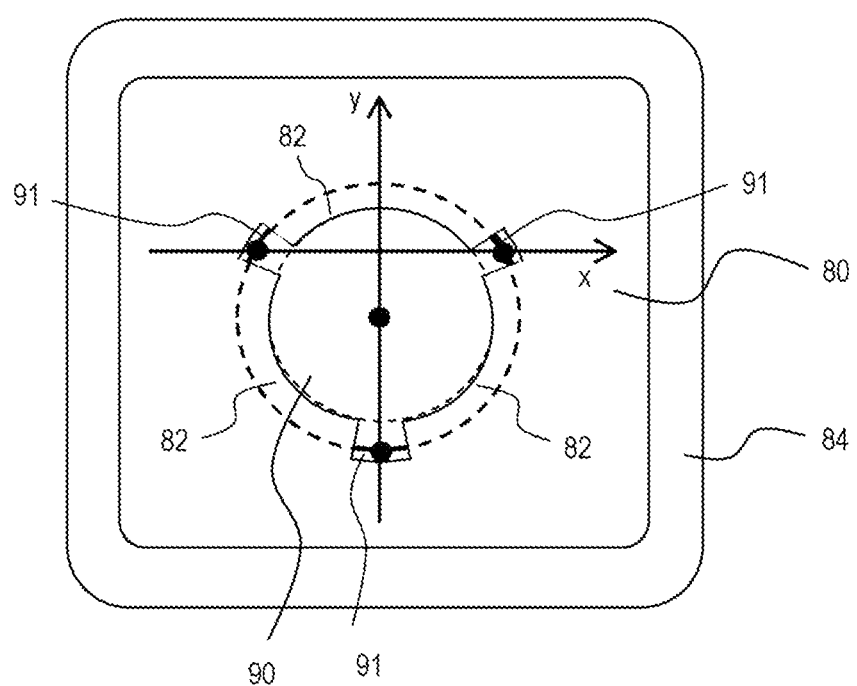
FIG. 10 is a figure for describing measuring a direction of a lens holding member in a lens holding member of an optical sensor module shown in FIG. 8.
Figure 11:
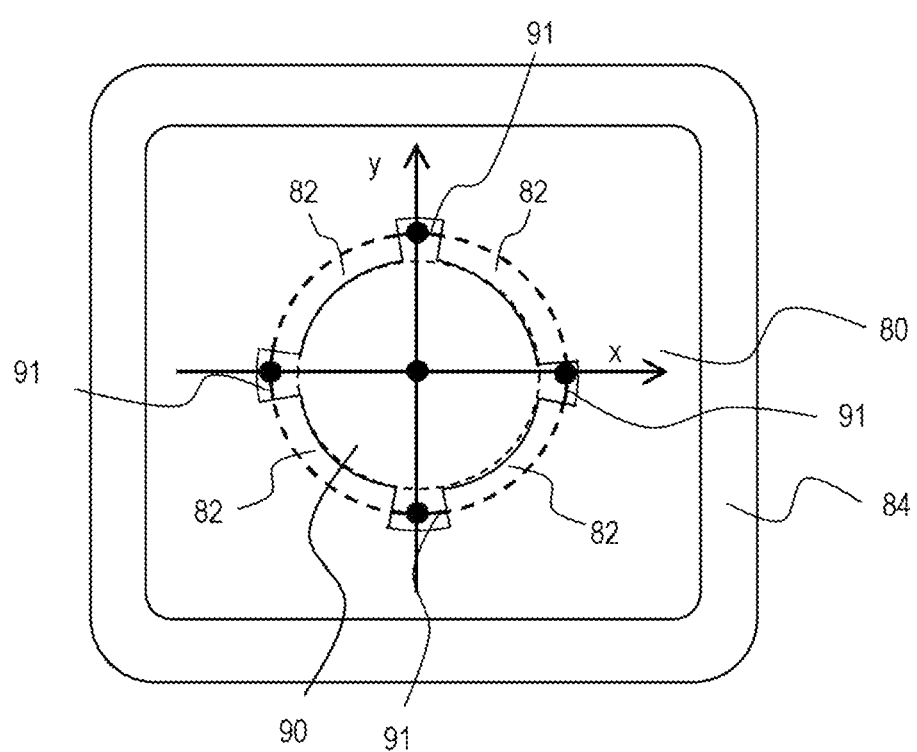
FIG. 11 is a figure for describing measuring a direction of a lens holding member in a lens holding member of an optical sensor module shown in FIG. 9.

Regarding a part where the outer edge 91 of the lens 90 is exposed, as shown in FIG. 9, four parts may be provided at 90 degrees interval, and parts more than four may be provided at regular intervals. As above mentioned, three or more parts where the outer edge 91 of the lens 90 is exposed from the lens holding member 80 are provided. When parts where the outer edge 91 of the lens 90 is exposed from the lens holding member 80 are recognized by camera, a circle which conforms to an external shape of the lens 90 can be correctly drawn based on the points which are recognized, therefore a focal point of the lens 90 can be recognized with high accuracy. In addition to that, in a case where the outer edge 91 is exposed at three parts at regular intervals as shown in FIG. 8 and three points at regular intervals on the outer edge 91 are determined as recognition points, as shown in FIG. 10, when two recognition points on the outer edge 91 which are opposing are connected to make a straight line, and other recognition point which is one of the three recognition points and a center of a circle which is obtained are connected to make a straight line, the two straight line can be made to be axes of xy coordinate which cross at right angles on the lens holding member 80. Alternatively as shown in FIG. 9, in a case where the outer edge 91 is exposed at four parts at regular intervals, as shown in FIG. 11, two straight lines which connect two recognitions points which are opposing and cross at right angles can be made to be axes of xy coordinate. As above mentioned, by measuring an angle formed by xy axes which are obtained from a stored image of the lens 90 in a case where a direction of the bottom surface 84 of the lens holding member 80 is an intended direction with regard to a glass epoxy substrate 20 and xy axes which is obtained from an image of the lens 90 which is recognized, rotation amount of a direction of the lens holding member 80 can be measured quantitatively, as a result, a direction of the lens holding member 80 can be corrected with higher accuracy.

As above mentioned, by exposing the outer edge of the lens 90 from the lens holding member 80, to which the lens 90 is fixed, at three or more parts at regular intervals, a focal point of the lens 90 can be recognized with higher accuracy and a direction of the lens holding member 80 can be corrected with higher accuracy.

In the above mentioned description, an outer edge of the lens 90 is exposed at a side of an inner surface of the lens holding member 80, however, it is needless to say such that a configuration in which an outer edge of the lens 90 is exposed at a side of an outer surface of the lens holding member 80 is acceptable.

A configuration of the lens holding member 80 which is described in Embodiment 3 can be applied to Embodiment 2. In a configuration in which vacuum-sealing is performed by a transparency plat 15 and a frame 151 which is described in Embodiment 2, it is not necessary to vacuum-seal inside the lens holding member 80, therefore it is not necessary for a part at which the lens 90 is fixed is airtight.

Embodiment 4

Figure 12:
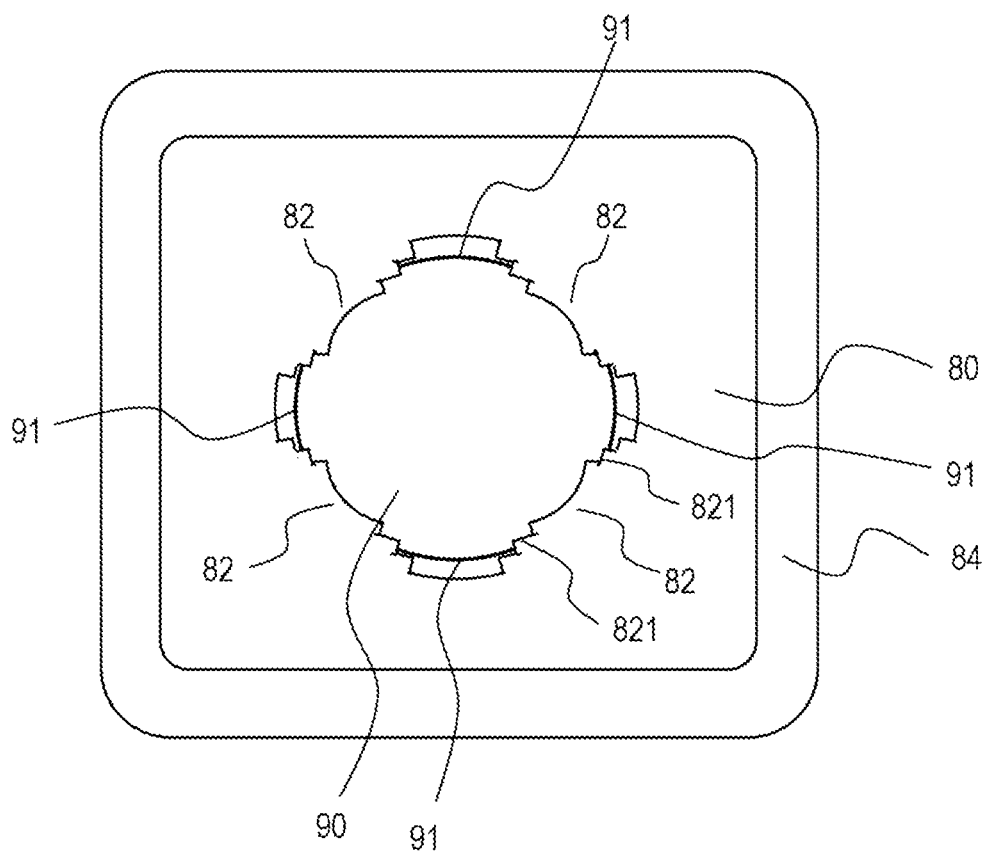
FIG. 12 is a bottom view showing a configuration of a lens holding member of an optical sensor module according to Embodiment 4.

FIG. 12 is a bottom view showing a lens holding member 80 of an optical sensor module according to Embodiment 4 observed from a side of a bottom surface 84. Basically, an optical sensor module according to Embodiment 4 has also the same configuration as that of Embodiment 1, however, an optical sensor module according to Embodiment 4 is different from that of Embodiment 1 in following points. Here, mainly, different points will be described, and description regarding the same components will be omitted. Further, FIG. 12 is a schematic diagram showing only a configuration of the lens holding member 80 in an optical sensor module according to Embodiment 4 and description regarding other components of an optical sensor module will be omitted.

As described in Embodiment 1, as a method for fixing a lens 90 to a top surface part of the lens holding member 80, a method in which after the lens 90 is inserted in an opening part of the lens holding member 80 which is formed by injection molding from a side of an outer surface of the lens holding member 80, a resin at a side of an outer surface of the lens holding member 80 in surroundings of the lens 90 is deformed with heat so as to be caulked. According to the abovementioned method, the outer circumference of the lens 90 is covered with the lens holding member 80 so as for the lens 90 and the lens holding member 80 to be integrally formed. In a case where after the lens holding member 80 is manufactured, the lens 90 is inserted and fixed by any method so as for the holding member 80 and the lens 90 to be integrally formed, both of variations of the lens holding member 80 itself and variations in size of the lens 90 should be considered. Consequently, it is necessary for a size of an opening part of the lens holding member 80 for inserting lens 90 to be larger than a size of the lens 90. In this case, when the lens 90 is inserted in an opening part of the lens holding member 80, it is surely such that a clearance space is generated between the lens 90 and an inner wall for forming an opening part of the lens holding member 80. The lens 90 can be freely moved in the abovementioned space, and in addition to that, the lens 90 is also moved by strength which is applied when the lens 90 is fixed. Further, in a case where the lens 90 is circle, it is also difficult to fix the lens 90 in the state where a position of the lens 90 in an opening part of the lens holding member 80 is determined by pushing the lens 90 at a specific position in an opening part of the lens holding member 80, etc. Consequently, it is difficult to determine a position of an optical center of the lens 90 with regard to a position of the outer circumference of the lens holding member 80 and, in comparison with machining accuracy of the lens holding member 80 and the lens 90 itself, a range of variation in size will be wide.

Consequently, even when a light receiving portion of the infrared detector 10 and a position of an optical center of the lens 90 are positioned with high accuracy so as to be assembled, in some cases, a position of an optical center of the lens 90 is greatly deviated with regard to a position of the outer circumference of the lens holding member 80. In this case, in the same way as that of a case where a direction of the lens holding member 80 is not a determined direction with regard to a direction of a substrate, there is a risk such that the bottom surface 84 of the lens holding member 80 or an inner wall of a side part 802 may contact with a wiring member at an inner side of the lens holding member 80. A wiring member which contacts with the bottom surface 84 of the lens holding member 80 or an inner wall may be deformed so as to contact with a wiring member in the surroundings or may be cut, as a result, there is a risk such that a failure such as malfunction of an optical sensor module may be caused.

After the lens 90 is fixed to the lens holding member 80, a clearance space which is formed between the lens 90 and an inner wall of the lens holding member 80 cannot be visually observed from outside. Consequently, in a prior inspection, it is difficult to find the lens holding member 80 in which a position of an optical center of the lens 90 with regard to a position of the outer circumference of the lens holding member 80 is greatly deviated, and consequently, there is a problem such that a defective product cannot be detected only after the lens holding member 80 is assembled with regard to the glass epoxy substrate 20.

Figure 13:
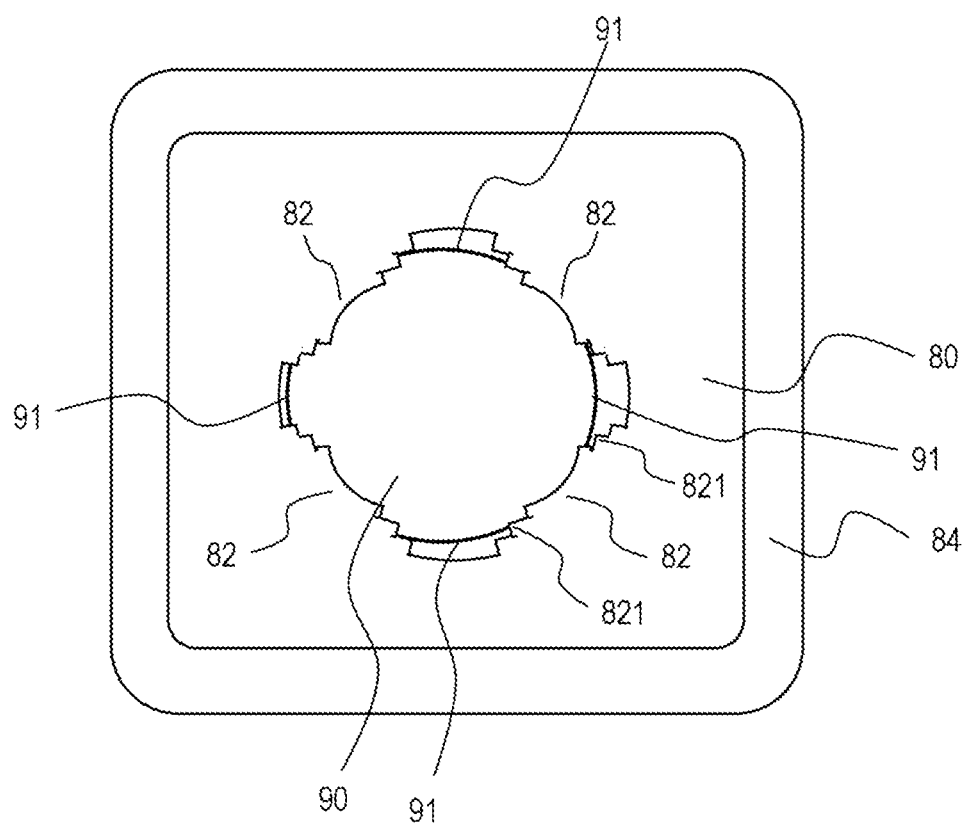
FIG. 13 is a figure for describing an effect of a lens holding member of an optical sensor module according to Embodiment 4.

In Embodiment 4, as shown in FIG. 12, regarding a shape of a resin of the lens holding part 82 which covers the outer circumference of the lens 90, that is, a boundary 821 between a part where the outer edge 91 of the lens 90 is exposed and a part where the outer edge 91 of the lens 90 is not exposed so as to cover the outer circumference of the lens 90, is formed in stepwise. A height of one step of steps is fixed, for example, 0.05 mm. Accordingly, as shown in FIG. 13, with regard to a position of the lens holding member 80 in the outer circumference, a deviation amount of the lens holding member 80 in which a position of an optical center of the lens 90 is greatly deviated can be measured by observing such that in what stage of steps, the outer edge 91 of the lens 90 exists. Before assembling the lens holding member 80 with regard to the glass epoxy substrate 20, by performing visual inspection of the lens holding member 80, the lens holding member 80, in which a position of an optical center of the lens 90 is greatly deviated with regard to a position of the outer circumference of the lens holding member 80, can be removed, therefore, assembly failure of an optical sensor module can be suppressed.

In the above mentioned, the outer edge 91 of the lens 90 is exposed at a side of an inner surface of the lens holding member 80, however, it is acceptable such that the outer edge 91 of the lens 90 is exposed at a side of an outer surface of the lens holding member 80. Further, a configuration of the lens holding member 80 which is described in Embodiment 4 can be applied to a configuration described in Embodiment 2 in which an infrared detector is vacuum-sealed by a transparency plate and a frame. Regarding an optical sensor module having the abovementioned configuration, it is not necessary to vacuum-seal inside the lens holding member 80, therefore, it is not necessary for a part at which the lens 90 is fixed to be airtight.

Embodiment 5

In Embodiment 5, a method for manufacturing an optical sensor module which is described in Embodiment 1 will be described referring to FIG. 14 to FIG. 16.

First, a glass epoxy substrate 20 to which an infrared detector 10 is bonded is manufactured. FIG. 14 is a plan view showing a glass epoxy substrate which is manufactured and FIG. 15 is a cross section showing the glass epoxy substrate. As shown in FIG. 14 and FIG. 15, an adhesive agent 70 is applied to the glass epoxy substrate 20 on which the infrared detector 10 and necessary members such as an exclusive IC, a wire, a capacitor, a connector, etc., which are not shown in figures., are bonded. As shown in FIG. 14, regarding the infrared detector 10, an alignment mark 11 is formed at a position to be reference, a position of the alignment mark 11 is used as reference, and at a position where a bottom surface 84 of a lens holding member 80 is bonded to the glass epoxy substrate 20, the adhesive agent 70 is applied.

Figure 16:
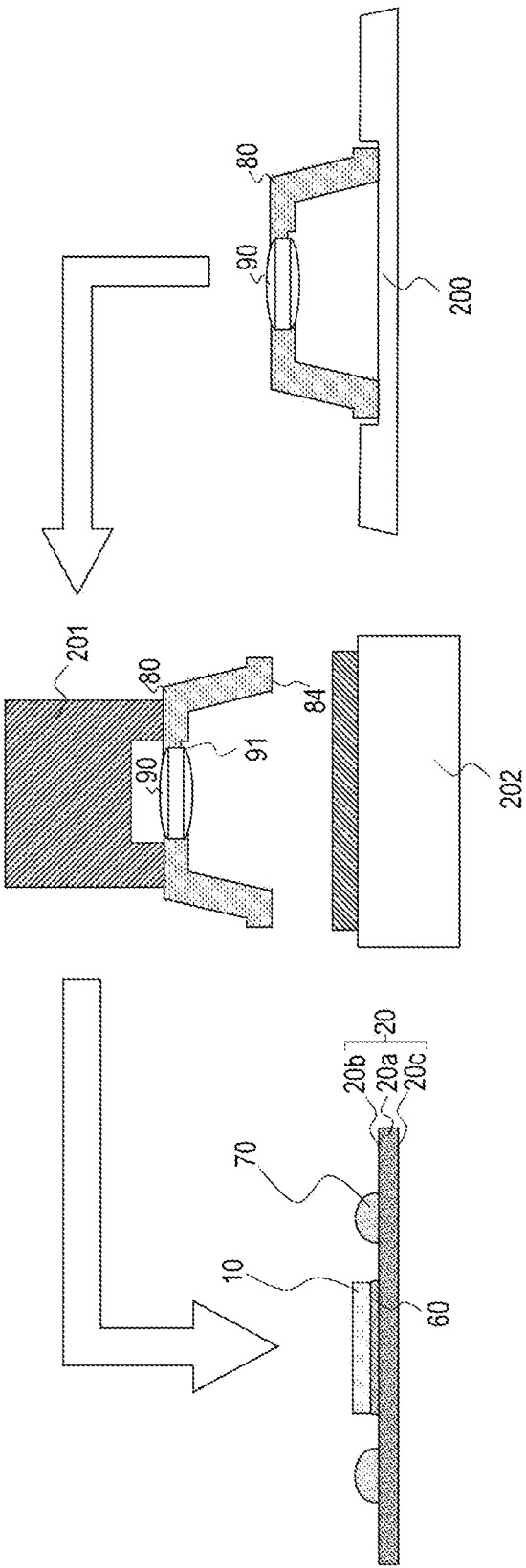
FIG. 16 is a third figure for describing a method of manufacturing an optical sensor module according to Embodiment 5.

As shown in FIG. 16, the lens holding member 80 to which a lens 90 is fixed is stored in an exclusive storage tray 200, by vacuum-suctioning a surface on which a lens is not fixed by a nozzle for conveying 201, the lens holding member 80 is conveyed to above the glass epoxy substrate 20 on which the adhesive agent 70 is applied. During the convey, the lens holding member 80 is moved above a camera 202, and the camera 202 captures an image of a part of the lens holding member 80, to which the lens 90 is fixed, from a side of the bottom surface 84 of the lens holding member 80.

For example, as described in FIG. 3, from the image which is captured, at least three points at different positions of an outer edge 91 of the lens 90 are determined, a circle including the three points which are determined is drawn and a position of a center of the circle is obtained by calculation. Further, by comparing the image which is captured and an image which is stored in advance as an image with a reference direction, and by making the lens holding part 82 covering the lens of the lens holding member 80, etc. to be reference, an angle for rotating the image which is captured so as for a direction of the image which is captured to be same as that of the image which is stored is calculated. During the convey by the nozzle for conveying 201, by rotating the nozzle for conveying 201 according to the angle which is calculated, a direction of the lens holding member 80 is corrected.

Figure 14:
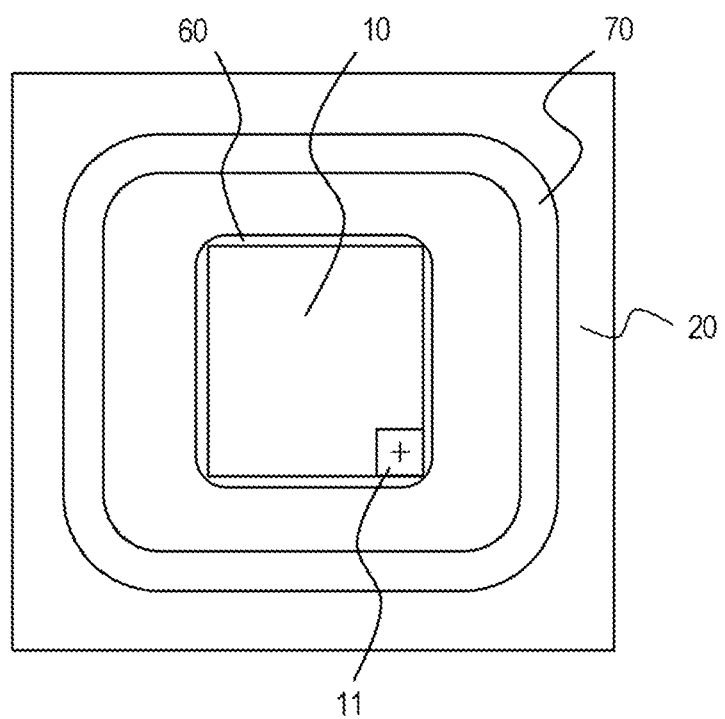
FIG. 14 is a first figure for describing a method of manufacturing an optical sensor module according to Embodiment 5.
Figure 15:
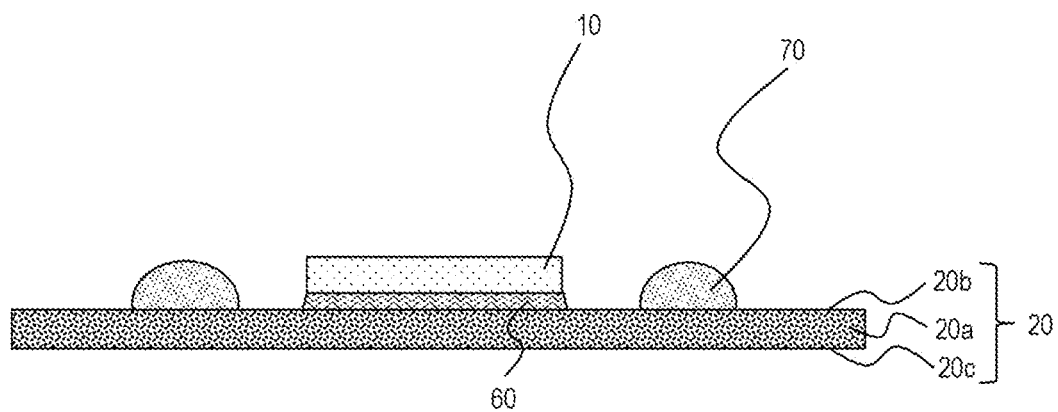
FIG. 15 is a second figure for describing a method of manufacturing an optical sensor module according to Embodiment 5.

The glass epoxy substrate 20 shown in FIG. 14 is imaged by another camera which is placed above, referring to a position of an alignment mark 11 which is formed at an edge of the infrared detector 10, a direction of the glass epoxy substrate 20 is set to be a reference direction and is placed. When a distance from the alignment mark 11 to a center of a light receiving portion of the infrared detector 10 is stored in a machine, based on a position of the alignment mark 11, a position of a center of a light receiving portion of the infrared detector 10 can be recognized. The nozzle for conveying 201 is moved to a position so as for the position of the center of the light receiving portion of the infrared detector 10 and the position of the optical center of the lens 90 which is obtained by calculation to be same. A direction of the lens holding member 80 which is attached by suction to the nozzle for conveying 201 is a direction same as the reference direction, therefore, a direction of the lens holding member 80 is matched to a direction of the glass epoxy substrate 20 which is placed to be the reference direction. After that, the nozzle for conveying 201 is lowered until the bottom surface 84 of the lens holding member 80 contacts the adhesive agent 70 and further the adhesive agent 70 is deformed to contact the glass epoxy substrate 20, and by breaking vacuum suction, only the nozzle for conveying 201 is raised to original position. Accordingly, the adhesive agent 70 is wetting and spreading to the bottom surface 84 of the lens holding member 80, and also the adhesive agent 70 is deformed to protrude to an inner side and an outer side of the bottom surface 84 of the lens holding member 80 so as to form a fillet.

After that, in the state in which the lens holding member 80 is bonded, the glass epoxy substrate 20 is conveyed to below an UV irradiation machine, and by irradiating with UV, a fillet part of the adhesive agent 70 which is formed outside of the bottom surface 84 of the lens holding member 80 is cured. By curing a fillet part of the adhesive agent 70, causing a positional displacement of the lens holding member 80 due to vibration can be avoided. When the glass epoxy substrate 20 is conveyed further so as to throw into a heating furnace, by heating for several hours at a temperature lower than a heatproof temperature of a member, the adhesive agent 70 is completely cured so as to complete bonding. As above mentioned, assemble of an optical sensor module is completed.

As above mentioned, by applying the adhesive agent 70 with reference to the alignment mark 11 which is formed on the infrared detector 10 so as to bond the lens holding member 80, without using active alignment, the position of the light receiving portion of the infrared detector 10 and the position of the optical center of the lens 90 can be positioned with high accuracy. In addition to that, crush or deformation of a wiring member which is caused by mismatching a direction of the lens holding member 80 and that of the glass epoxy substrate 20 can be avoided, the adhesive agent 70 is wetted and spread on the bottom surface 84 of the lens holding member 80, and as a result, inside of the lens holding member 80 can be surely sealed. Consequently, an optical sensor module having high quality can be assembled at low cost.

In the above mentioned, as the adhesive agent 70, an adhesive agent which is cured by UV and heat is used, however, an adhesive agent which cured only by UV or heat may be used, or an adhesive agent in which two types of liquids are mixed to cure in a fixed time may be used. By using an adhesive agent which is cured by UV and heat, by irradiating UV in a machine which is the same machine on which the lens holding member 80 is mounted, the adhesive agent 70 which forms a fillet outside the lens holding member 80 can be cured. After that, in order to cure whole of the adhesive agent by heat, it is necessary to take out the optical sensor module from the machine and convey, however, the fillet part is cured, therefore, moving of the lens holding member 80 due to swing, vibration, impact, etc., which is caused during convey can be prevented. Consequently, use of an adhesive agent which is cured by UV and heat is preferable for a technology which is disclosed by this application in which a relative position of a light receiving portion of an infrared detector and a lens can be positioned with high accuracy.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF REFERENCE CHARACTERS 10. infrared detector (photodetector)
15. transparency plate (light transmitting member)
20. glass epoxy substrate (substrate)
20a. glass epoxy base material
80. lens holding member
82. lens holding part
821. boundary
84. bottom surface
85. inner wall
86. projection
90. lens
91. outer edge of a lens

The invention claimed is:

1. An optical sensor module, comprising:
a substrate,
photodetector which detects light and is fixed to the substrate,
a lens holding member to which a lens is fixed and which is fixed to the substrate at a position surrounding the photodetector,
wherein the lens is fixed by a state in which an outer circumference of the lens is covered, on a photodetector side of the lens, by a material of the lens holding member, and
a part of an outer edge of the lens is exposed at a side of an inner surface of the lens holding member.

2. The optical sensor module according to claim 1, wherein the part where the outer edge of the lens is exposed is more than one quarter and less than half of whole of the outer edge of the lens.

3. The optical sensor module according to claim 1, wherein the part where the outer edge of the lens is exposed is dispersed at three or more parts at regular intervals.

4. The optical sensor module according to claim 1, wherein a boundary of a part of the lens holding member where the outer edge of the lens is exposed and a part of the lens holding member where the outer edge of the lens is not exposed so as for the outer circumference of the lens to be covered is formed in stepwise.

5. The optical sensor module according to claim 1, wherein an inner wall of the lens holding member opposing a side surface of the lens has three or more projections which protrude to a side of a side surface of the lens.

6. The optical sensor module according to claim 1, wherein a light incidence side of the photodetector is vacuum-sealed with a member containing a light transmitting member.

7. The optical sensor module according to claim 1, wherein at a light incidence side of the photodetector, an alignment mark for positioning is formed.

8. A method for manufacturing the optical sensor module according to claim 1 in which the outer edge of the lens is circle, comprising steps of:
capturing an image from a photodetector side of the lens of a part of the lens holding member at which the lens is fixed, the image including a side where the outer edge of the lens is exposed and obtaining a position of an optical center of the lens based on a circle which includes at least three points of the outer edge of the lens in the image which is captured; and
setting a position of the lens holding member for the optical center of the lens which is obtained to be placed directly above a light receiving portion of the photodetector, and fixing the lens holding member and the substrate.

9. The method for manufacturing the optical sensor module according to claim 8, wherein a position of the light receiving portion of the photodetector is determined by using an alignment mark which is formed at a light incidence side of the photodetector.

10. The method for manufacturing the optical sensor module according to claim 8,
wherein a step of comparing the image, which is captured, of the part of the lens holding member at which the lens is fixed and an image which is stored in advance to be reference and correcting a direction of the lens holding member is included.

11. The optical sensor module according to claim 1, wherein a surface of the lens opposite to the photodetector extends beyond an outer surface of the lens holding member.

12. An optical sensor module, comprising:
a substrate;
a photodetector which detects light and is fixed to the substrate; and
a lens holding member to which a lens is fixed, and which is fixed to the substrate at a position surrounding the photodetector,
wherein the lens is fixed by a state in which an outer circumference of the lens is covered by a material of the lens holding member,
a part of an outer edge of the lens is exposed at a side of an inner surface of the lens holding member, and a surface of the lens opposite to the photodetector extends beyond an outer surface of the lens holding member.

13. The optical sensor module according to claim 12, wherein the part where the outer edge of the lens is exposed is more than one quarter and less than half of whole of the outer edge of the lens.

14. The optical sensor module according to claim 12, wherein the part where the outer edge of the lens is exposed is dispersed at three or more parts at regular intervals.

15. The optical sensor module according to claim 12, wherein a boundary of a part of the lens holding member where the outer edge of the lens is exposed and a part of the lens holding member where the outer edge of the lens is not exposed so as for the outer circumference of the lens to be covered is formed in stepwise.

16. The optical sensor module according to claim 12, wherein an inner wall of the lens holding member opposing a side surface of the lens has three or more projections which protrude to a side of a side surface of the lens.

17. The optical sensor module according to claim 12, wherein a light incidence side of the photodetector is vacuum-sealed with a member containing a light transmitting member.

18. The optical sensor module according to claim 12, wherein at a light incidence side of the photodetector, an alignment mark for positioning is formed.

19. A method for manufacturing the optical sensor module according to claim 12 in which the outer edge of the lens is a circle, comprising steps of:
    capturing an image from a photodetector side of the lens of a part of the lens holding member at which the lens is fixed, the image including a side where the outer edge of the lens is exposed and obtaining a position of an optical center of the lens based on a circle that includes at least three points of the outer edge of the lens in the image which is captured; and
    setting a position of the lens holding member for the optical center of the lens which is obtained to be placed directly above a light receiving portion of the photodetector and fixing the lens holding member and the substrate.

20. The method for manufacturing the optical sensor module according to claim 19, wherein a position of the light receiving portion of the photodetector is determined by using an alignment mark which is formed at a light incidence side of the photodetector.

21. The method for manufacturing the optical sensor module according to claim 19,
    wherein a step of comparing the image, which is captured, of the part of the lens holding member at which the lens is fixed and an image which is stored in advance to be reference and correcting a direction of the lens holding member is included.

* * * * *